United States Patent
Zhang et al.

(10) Patent No.: US 12,009,841 B2
(45) Date of Patent: Jun. 11, 2024

(54) ERROR RECOVERY USING ADAPTIVE LLR LOOKUP TABLE

(71) Applicant: Innogrit Technologies Co., Ltd., Shanghai (CN)

(72) Inventors: Han Zhang, San Jose, CA (US); Chenrong Xiong, San Jose, CA (US); Jie Chen, Milpitas, CA (US)

(73) Assignee: Innogrit Technologies Co., Ltd., Shanghai (CN)

( * ) Notice: Subject to any disclaimer, the term of this patent is extended or adjusted under 35 U.S.C. 154(b) by 41 days.

(21) Appl. No.: 17/985,829

(22) Filed: Nov. 12, 2022

(65) Prior Publication Data

US 2023/0086057 A1  Mar. 23, 2023

Related U.S. Application Data

(63) Continuation of application No. 17/204,079, filed on Mar. 17, 2021, now Pat. No. 11,528,039.

(51) Int. Cl.
*H03M 13/39* (2006.01)
*H03K 19/17728* (2020.01)
*H03M 13/11* (2006.01)

(52) U.S. Cl.
CPC .. *H03M 13/3927* (2013.01); *H03K 19/17728* (2013.01); *H03M 13/1117* (2013.01); *H03M 13/1145* (2013.01)

(58) Field of Classification Search
CPC ......... H03M 13/3927; H03M 13/1117; H03M 13/1145; H03M 13/3769; H03M 13/45; H03M 13/6325; H03K 19/17728; G06F 11/1012; G11C 16/26; G11C 29/028; G11C 29/42; G11C 29/52
See application file for complete search history.

(56) References Cited

U.S. PATENT DOCUMENTS

| | | | |
|---|---|---|---|
| 10,903,861 B2 * | 1/2021 | Sandell | H03M 13/458 |
| 2012/0224420 A1 * | 9/2012 | Sakurada | G11C 8/08 365/185.03 |
| 2013/0163328 A1 * | 6/2013 | Karakulak | G11C 16/26 365/185.18 |
| 2014/0223263 A1 * | 8/2014 | Sakurada | G06F 11/1008 714/773 |
| 2014/0281800 A1 * | 9/2014 | Micheloni | H03M 13/255 714/759 |

(Continued)

*Primary Examiner* — Steve N Nguyen
(74) *Attorney, Agent, or Firm* — IPro, PLLC

(57) ABSTRACT

Systems and methods are provided for performing error recovery using LLRs generated from multi-read operations. A method may comprise selecting a set of decoding factors for a multi-read operation to read a non-volatile storage device multiple times. The set of decoding factors may include an aggregation mode for aggregating read results of multiple reads. The method may further comprise issuing a command to the non-volatile storage device to read user data according to the set of decoding factors, generating a plurality of Log-Likelihood Ratio (LLR) values using a mapping engine from a pre-selected set of LLR value magnitudes based on the set of decoding factors, obtaining an aggregated read result in accordance with the aggregation mode and obtaining an LLR value from the plurality of LLR values using the aggregated read result as an index.

20 Claims, 4 Drawing Sheets

(56) References Cited

U.S. PATENT DOCUMENTS

| | | | |
|---|---|---|---|
| 2015/0149840 A1* | 5/2015 | Alhussien | G11C 16/08 |
| | | | 714/719 |
| 2022/0021400 A1* | 1/2022 | Boutillon | H03M 13/6577 |
| 2022/0116058 A1* | 4/2022 | Akkem | H03M 13/6591 |

* cited by examiner

ERROR RECOVERY USING ADAPTIVE LLR LOOKUP TABLE

TECHNICAL FIELD

The disclosure herein relates to error recovery in error correction code (ECC) decoding, particularly relates to adaptively generating log-likelihood ratio (LLR) values for error recovery.

BACKGROUND

The evolution of the modern computing system is driven in-part by the emergence of the non-volatile memory (e.g., NAND or NOR) storage devices based storage systems such as solid-state drives (SSD) and USB flash drives that have demonstrated higher performance of speed and latency over traditional hard drives or floppy disks. One issue for these storage systems is data corruption and therefore data is typically encoded using an error-correcting code (ECC). ECC adds redundant data or parity data to user data so that user data can be recovered by a reader even when a number of errors (up to the capability of the code being used) were introduced.

Encoded data retrieved from the storage devices need to be decoded. ECC decoding includes hard decision decoding and soft decision decoding. Soft decision decoding is more powerful than hard decision decoding and can recover errors that hard decision decoding cannot recover. Soft decision decoding relies on soft decision information, which indicates the reliability of a bit value and typically is in the form of a log likelihood ratio (LLR). Some non-volatile storage devices can provide soft decision information but a lot of non-volatile storage devices do not. Moreover, the storage controller typically is in control of the error recovery process and should be able to decide which LLR values may be best for soft decoding operations. Therefore, there is a need in the art for the storage controller to generate the LLR based on the configuration details of the error recovery process.

SUMMARY

The present disclosure provides a system and method for generating log likelihood ratio (LLR) for soft decision decoding. Various embodiments of a non-volatile storage controller may implement a complicated error recovery flow that requires reading same user data multiple times and generates soft decision information from multiple read results. In some embodiments, the error recovery flow may be referred to as an extended re-read operation or a multi-read operation. In the multi-read operation, a set of decoding factors may be selected and multiple reads may be performed to retrieve additional data (or information associated with the original user data) from a non-volatile storage device (e.g., a NAND device) with different reference voltage ($V_{ref}$) settings. Log-Likelihood Ratio (LLR) values may be generated by an LLR engine in accordance with the set of decoding factors. An aggregated read result may be obtained from multiple read results and used as an index to retrieve one LLR value from the LLR values generated by the LLR engine. The LLR value may be used in a soft decision decoder to recover the original failed codewords.

In an exemplary embodiment, there is provided a method that may comprise selecting a set of decoding factors for a multi-read operation to read a non-volatile storage device multiple times. The set of decoding factors may include a total number of reads, an aggregation mode for aggregating read results of multiple reads, and whether the read results include soft data. The method may further comprise issuing a command to the non-volatile storage device to read user data according to the set of decoding factors, generating a plurality of Log-Likelihood Ratio (LLR) values using a mapping engine that outputs the plurality of LLR values from a pre-selected set of LLR value magnitudes based on the set of decoding factors, obtaining an aggregated read result in accordance with the aggregation mode, and obtaining an LLR value from the plurality of LLR values using the aggregated read result as an index.

In another exemplary embodiment, there is provided a storage system controller. The storage system controller may comprise a processor configured to: select a set of decoding factors for a multi-read operation to read a non-volatile storage device multiple times, and issue a command to the non-volatile storage device to read user data according to the set of decoding factors. The set of decoding factors may include a total number of reads, an aggregation mode for aggregating read results of multiple reads, and whether the read results include soft data. The storage system controller may further comprise a mapping engine and a soft decision decoder. The mapping engine may be configured to generate a plurality of Log-Likelihood Ratio (LLR) values from a pre-selected set of LLR value magnitudes based on the set of decoding factors. The soft decision decoder may be configured to obtain an LLR value from the plurality of LLR values using an aggregated read result as an index and perform a soft decision decoding using the LLR value. The aggregated read result may be obtained in accordance with the aggregation mode.

In yet another exemplary embodiment, there is provided a method comprising pre-selecting a set of Log-Likelihood Ratio (LLR) value magnitudes, initiating a plurality of multi-read operations by selecting a respective set of decoding factors for each of the plurality of multi-read operations and issuing read commands corresponding to the plurality of multi-read operations. Each respective set of decoding factors may include a total number of reads, an aggregation mode for aggregating read results of multiple reads, and whether the read results include soft data. The method may further comprise processing the plurality of multi-read operations using a mapping engine and a soft decision decoder in a pipelined manner. In a first pipeline stage, the mapping engine may generate an LLR lookup table (LUT) from the set of LLR value magnitudes based on a set of decoding factors corresponding to one of the plurality of multi-read operations that has finished reading data. And in a second pipeline stage, the soft decision decoder may perform soft decision decoding using an LLR value obtained from the LLR LUT with an aggregated read result as an index. The aggregated read result may be obtained in accordance with the aggregation mode in the set of decoding factors corresponding to the one of the plurality of multi-read operations that has finished reading data.

DETAILED DESCRIPTION

Figure 1:
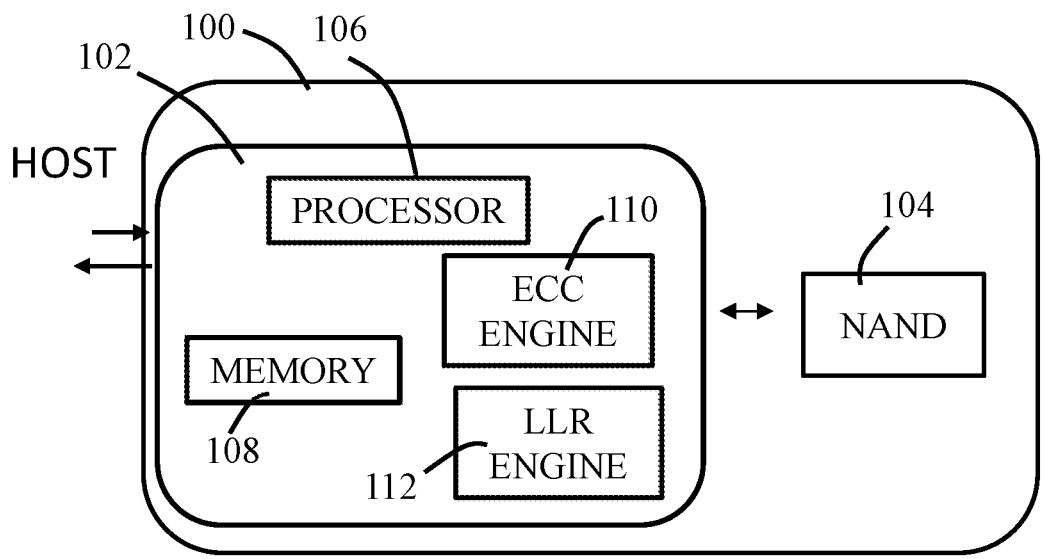
FIG. 1 schematically shows a non-volatile storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides apparatuses, systems and methods for performing a multi-read operation for data stored in non-volatile memory (NVM) storage devices that are encoded with an error-correcting code (ECC) (e.g., Turbo, Low-Density Parity-Check (LDPC), and Polar, etc.). FIG. 1 schematically shows a non-volatile storage system 100 in accordance with an embodiment of the present disclosure. The non-volatile storage system 100 may comprise a non-volatile storage controller 102 and a non-volatile storage device 104. The non-volatile storage system 100 may provide data storage and/or access to stored data for a host when it is coupled to the host. The non-volatile storage device 104 may be a non-volatile memory (NVM) based storage device, for example, a NAND device. It should be noted that the non-volatile storage system 100 may comprise a plurality of non-volatile storage devices and the non-volatile storage device 104 may be shown as a representative for the plurality of non-volatile storage devices.

The non-volatile storage controller 102 may comprise a processor 106, a memory 108, an ECC engine 110 and an LLR engine 112. The processor 106 may be a computer processor, such as, but not limited to, a microprocessor or a microcontroller. The memory 108 may be a non-transitory computer-readable storage media, such as, DRAM or SRAM, to store computer executable instructions to be executed by the processor 106.

The ECC engine 110 may comprise one or more ECC encoders and also may comprise one or more ECC decoders. The one or more ECC encoders may generate ECC data based on input data to be stored and the ECC data (including the input data) may be stored in the non-volatile storage device 104 in a write (program) operation. The one or more ECC decoders may decode ECC data retrieved from the non-volatile storage device 104 in a read operation and correct errors in the stored data retrieved from the non-volatile storage device 104.

In some embodiments, the non-volatile storage controller 102 may be configured to use multiple reads to generate soft decision information (e.g., LLR) and use the generated soft decision information to feed into a soft decision decoder of the ECC engine 110 to perform soft decision decoding. For example, multiple reads of same data may be needed if a hard decision decoder in the ECC engine 110 fails to decode the read result of the read operation. In a multi-read flow, multiple reads may be performed to retrieve additional data (or information associated with the original user data) from the non-volatile device 104 with different $V_{ref}$ settings. In one embodiment, the processor 106 may execute instructions in the memory 108 to initial a multi-read operation to read the same data multiple times.

Soft decision information (e.g., LLR) may be generated based on multiple read results of the multi-read operation.

The LLR engine 112 may be configured to generate a plurality of LLR values based on characteristics of the non-volatile storage device 104, parameters of the decoding methods used in the multi-read flow, or both. The plurality of LLR values may referred to as an LLR lookup table (LUT) and each of the plurality of LLR values may be accessed by an index. The characteristics of the non-volatile storage device 104 and decoding methods that affect the LLR values may be referred to as decoding factors. The LLR engine 112 may generate different LLR LUTs for different sets of decoding factors, with each LLR LUT generated according to one set of decoding factors. In various embodiments, multiple read results of one multi-read operation may be aggregated and used as an index for to retrieve one LLR value from the LLR LUT.

The non-volatile storage controller 102 may be configured to select the set of decoding factors to be used in a multi-read operation and issue a command to the non-volatile storage device 104 to read data stored therein according to the decoding factors. For example, the processor 106 may execute software instructions in the memory 108 to select the decoding factors. The LLR engine 112 may be configured to generate soft decision information in the form of LLR values based on the selected decoding factors. The ECC engine 110 may comprise at least one soft decision decoder that may be configured to use the LLR value obtained from the LLR engine 112 to perform soft decision decoding for the multi-read operation. It should be noted that although FIG. 1 shows that the LLR engine 112 is outside of the ECC engine 110, in some embodiments, the LLR engine 112 may be part of the ECC engine 110.

Figure 2:
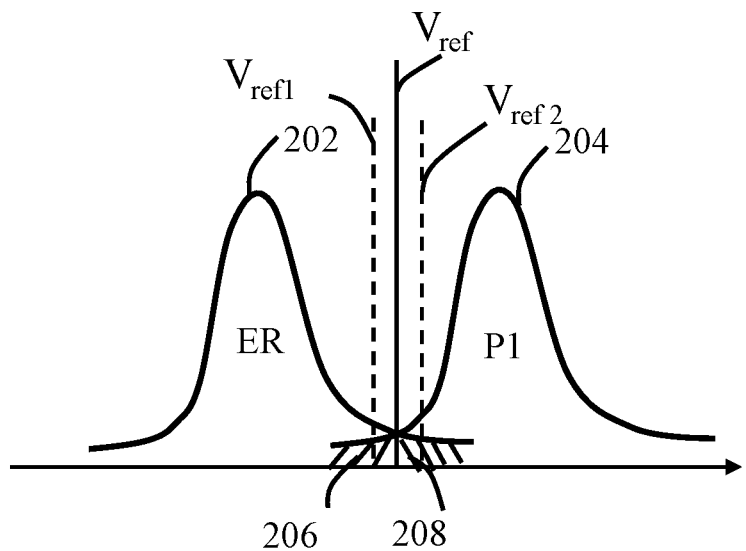
FIG. 2 schematically show multiple reads of a single level cell (SLC) in accordance with an embodiment of the present disclosure.

FIG. 2 schematically show multiple reads of a single level cell (SLC) in accordance with an embodiment of the present disclosure. The horizontal axis in FIG. 2 may be voltage. The vertical axis in FIG. 2 may be the probability of threshold voltage. The curve 202 in FIG. 2 may indicate the probability of data in the storage cell in a first logic state, for example, logic one (e.g., "1"), which may also be referred to as the erase (ER) state. The curve 204 in FIG. 2 may indicate the probability of data in a second logic state, for example, logic zero (e.g., "0"), which may also be referred to as the P1 state.

Data stored in the storage cell may be read by applying the read reference voltage $V_{ref}$ to the storage cell. The first logic state and the second logic state may be two adjacent states distinguished by the read reference voltage $V_{ref}$. If the threshold voltage of the storage cell is less than the read reference voltage $V_{ref}$, logic one may be obtained as a hard decision read result. If the threshold voltage of the storage cell is larger than the read reference voltage $V_{ref}$, logic zero may be obtained as a hard decision read result.

As shown in FIG. 2, the curve 202 may have a tail portion 208 extending past the read reference voltage $V_{ref}$ into the territory that may be regarded as in the second logic state, and the curve 204 may have a tail portion 206 extending past the read reference voltage $V_{ref}$ into the territory that may be regarded as in the first logic state. In the tail portion 206, although the threshold voltage is less than the read reference voltage $V_{ref}$ and the read result may be logic one (e.g., "1"), the correct logic state may be the second logic state (e.g., "0"). In the tail portion 208, although the threshold voltage is larger than the read reference voltage $V_{ref}$ and the hard decision read result may be logic zero (e.g., "0"), the correct logic state may be the first logic state (e.g., "1").

During a decoding process, the incorrectly labeled bits may be corrected. That is, during a decoding process by a decoder in the ECC engine 110, bits with threshold voltages in the portion 306 that may be incorrectly labeled as logic state one may be flipped to logic state two, and bits with threshold voltages in the portion 308 that may be incorrectly labeled as logic state two may be flipped to logic state one. Multiple reads may help the non-volatile storage controller 102 generate soft decision information for soft decision decoding.

FIG. 2 shows three read reference voltages $V_{ref}$, $V_{ref1}$ and $V_{ref2}$ may be used for a multi-read operation. $V_{ref1}$ and $V_{ref2}$ may be read reference voltages close to the original read reference voltage $V_{ref}$ and smaller and larger than the original read reference voltage $V_{ref}$, respectively. As indicated in FIG. 2, compared to the read reference voltage $V_{ref}$ at the position of the read reference voltage $V_{ref1}$, the probability of logic one state is increased and the probability of logic state two is decreased. Also, compared to at read reference voltage $V_{ref}$ at the position of the read reference voltage $V_{ref2}$, the probability of logic two state is increased and the probability of logic state one is decreased. Thus, if three read results generated by the three read reference voltage $V_{ref}$, $V_{ref1}$ and $V_{ref2}$ are all "1", then "1" may have a stronger reliability than two out of three or one out of three read results being "1". Similarly, if three read results generated by the three read reference voltages $V_{ref}$, $V_{ref1}$ and $V_{ref2}$ are all "0", then "0" may have a stronger reliability than a two out of three or one out of three read results being "0". It should be noted that each read reference voltage may be applied to read a page of storage cells at the same time and thus the same page may be read with the same read reference voltages (e.g., $V_{ref}$, $V_{ref1}$ and $V_{ref2}$).

Some non-volatile storage devices may provide soft decision read result, also called soft data, in addition to hard decision read result. The hard decision read result may also be called hard data and refer to the bit value obtained by whether the threshold voltage is less than (e.g., logic one) or greater than (e.g., logic zero) the read reference voltage. In subsequent reads after the first read using the original read reference (e.g., $V_{ref}$), an XOR operation may be applied to the bit values obtained by two read reference voltages on two sides of the original read reference. In embodiments in which the non-volatile storage device 104 may provide soft decision read result, the bit values obtained by applying $V_{ref1}$ and $V_{ref2}$ may be XORed. In some embodiments, the non-volatile storage device 104 may provide the XOR result as the soft decision read result. In some other embodiments, the non-volatile storage device 104 may flip the XOR result and provide the flipped XOR result as the soft decision read result. Regardless of whether the XOR result is flipped before being provided as the soft decision read result, the specification of the non-volatile storage device 104 may specify which one of "1" or "0" may indicate whether the bit value obtained by the original read reference voltage may be deemed reliable.

It should be noted that the read reference voltages other than the original read reference need not be equally distributed around the original read reference voltage for subsequent reads with hard decision results. For example, the read reference voltages $V_{ref1}$ and $V_{ref2}$ may be chosen by the non-volatile storage controller 102 to be both less than or larger than $V_{ref}$. Moreover, even if the read reference voltages $V_{ref1}$ and $V_{ref2}$ maybe in two opposite sides of the original read reference voltage $V_{ref}$, their distances to the original read reference voltage $V_{ref}$ may be equal but that's not required.

Figure 3:
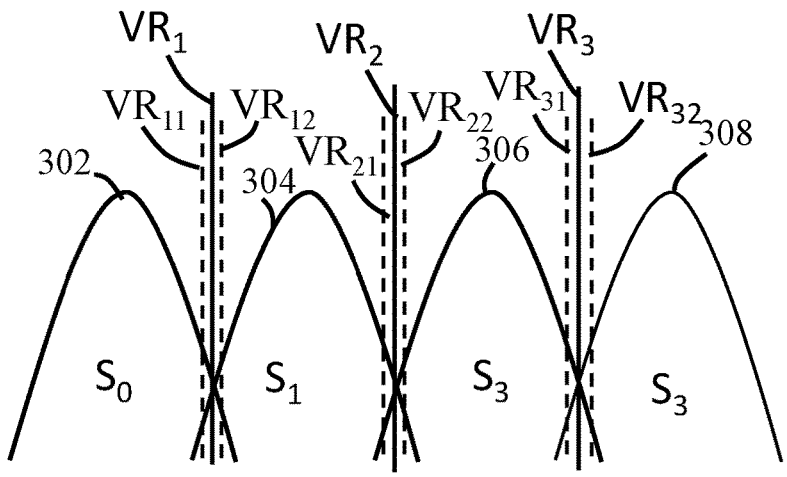
FIG. 3 schematically show multiple reads of a multi-level cell (MLC) in accordance with an embodiment of the present disclosure.

FIG. 3 schematically show multiple reads of a storage cell of a multi-level cell (MLC) in accordance with an embodiment of the present disclosure. One MLC may store two bits of data, which may be referred to as a least significant bit (LSB) and a most significant bit (MSB). Each MLC may be in one of four separate states $S_0$, $S_1$, $S_2$ and $S_3$. These four separate states $S_0$, $S_1$, $S_2$ and $S_3$ may have corresponding respective probability distribution curves 302, 304, 306 and 308. Three read reference voltages $VR_1$, $VR_2$ and $VR_3$ may be needed for reading data in MLC, with $VR_2$ for reading LSB pages, and $VR_1$ and $VR_3$ for reading MSB pages. In a multi-read operation with three reads, the read reference voltages $VR_2$, $VR_{21}$ and $VR_{22}$ may be used for reading a LSB page, with $VR_2$ being the original read reference voltage for the LSB page and $VR_{21}$ and $VR_{22}$ being smaller and larger than the original read reference voltage for the LSB page. And the read reference voltages $VR_1$, $VR_{11}$ and $VR_{12}$ and $VR_3$, $VR_{31}$ and $VR_{32}$ may be used for reading a MSB page, with $VR_1$ and $VR_3$ being the original read reference voltages for the MSB page, $VR_{11}$ and $VR_{12}$ being smaller and larger than $VR_1$, and $VR_{31}$ and $VR_{32}$ being smaller and larger than $VR_3$.

In some embodiments, the storage cells may store data values of three or more bits. For example, triple-level cell (TLC) may store three bits per cell and quad-level cell (QLC) may store four bits per cell. These storage cells may need more read reference voltages to read data stored therein. For example, TLC may need 7 read reference voltages for reading data in LSB, center significant bit (CSB) and MSB pages, which may also be referred to as lower, middle and upper pages. Embodiments using these storage cells (e.g., TLC or QLC) may also perform multiple reads with varying read reference voltages.

Figure 4:
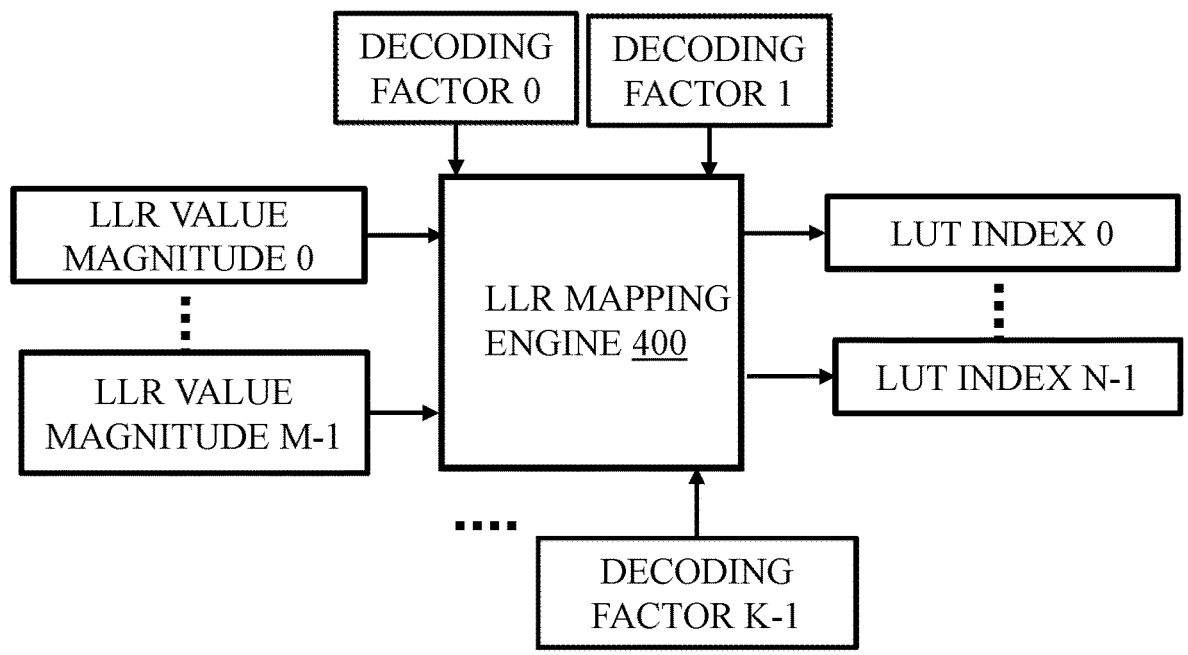
FIG. 4 schematically show an LLR mapping engine in accordance with an embodiment of the present disclosure.

FIG. 4 schematically shows an LLR mapping engine 400 in accordance with an embodiment of the present disclosure. The LLR mapping engine 400 may be an embodiment of the LLR engine 112. The LLR mapping engine 400 may be configured to automatically and adaptively generate a table of LLR values from a pre-selected set of LLR value magnitudes according to a set of decoding factors, and the mapping relationship may be fully determined by the set of decoding factors. When the set of decoding factors are changed to another set of decoding factors, the LLR mapping engine 400 may generate another table of LLR values from the pre-selected set of LLR value magnitudes.

In some embodiments, the pre-selected set of LLR value magnitudes may also change according to decoding factors and/or based on characteristics of the non-volatile storage device 104. For example, during the lifetime of the non-volatile storage device 104, when the non-volatile storage device 104 gets more program/erase (P/E) cycles, the pre-selected set of LLR value magnitudes may change. In various embodiments, the pre-selected set of LLR value magnitudes may come from NVM vendor specifications and NVM characterization results.

The pre-selected set of LLR value magnitudes may be stored in a register bank with a plurality of registers of LLR Value Magnitude 0 through LLR Value Magnitude M−1, with M being a positive integer. In some embodiments, the number M may be 16. In a non-exclusive example, 16 LLR value magnitudes in the plurality of registers of LLR Value Magnitude 0 through LLR Value Magnitude 15 may be zero to 15. The table of LLR values generated by the LLR mapping engine 400 may contain entries LUT Index 0 through LUT Index N−1, with N being a positive integer. In some embodiments, the number of entries in the generated table of LLR values may depend on the size of the index. For example, if the index has 9 bits, the number of entries in the generated table of LLR values may be 2 to the power of 9, that is, N may be 512. The LLR values generated by the LLR mapping engine 400 may contain a sign bit and thus may have one more bit than the LLR value magnitudes in the plurality of registers of LLR Value Magnitude 0 through LLR Value Magnitude 15. For example, if the LLR value magnitudes in the plurality of registers of LLR Value Magnitude 0 through LLR Value Magnitude 15 have 4 bits, then the LLR values in the entries LUT Index 0 through LUT Index N−1 may have 5 bits.

Many decoding factors may affect the LLR values output from the LLR mapping engine 400. The decoding factors may determine how M inputs may be mapped to N outputs with each of the M inputs may be mapped to one or many outputs but each of the N outputs only being mapped to one of the M inputs. Exemplary decoding factors may include, but not limited to, the total number of reads in a multi-read operation, availability of hard data and soft data, reliability bit representation in soft read (i.e., using 0 or 1 to represent strong or weak bit in a soft read), how read results may be aggregated for processing, and page type (e.g., lower/middle/upper/extra page from different non-volatile memory device vendors). The Decoding Factor 0 through Decoding Factor K−1 coupled to the LLR mapping engine 400 may be a subset of all possible decoder factors and selected by the non-volatile storage controller 102 for each multi-read operation, with K being a positive integer. In one embodiment, the set of decoding factors (e.g., the Decoding Factor 0 through Decoding Factor K−1) may change for each multi-read operation.

In some embodiments, the LLR mapping engine 400 may generate LLR LUTs according to a mapping algorithm that uses a weighted index value. In this mapping algorithm, index to each entry of the LLR LUT may be represented as a binary number and a weighted index value may be calculated by assigning each bit value of the binary number a weight. A sum of weighted bit values may be obtained as a weighted index value and mapped to one of the pre-selected set of LLR value magnitudes. The weights and mapping may be uniquely determined by the set of decoding factors and based on characterization data. During operation, multiple read results for one user data bit may be aggregated to generate an aggregated read result and the aggregated read result may be used as an index to obtain one LLR value from the generated LLR LUT.

The decoding factor of how read results may be aggregated for processing may be referred to as aggregation mode. In some embodiments, the aggregation mode may be one of two modes: direct mode and indirect mode. In the embodiment that the index is 9-bit wide, the aggregated read result for one user data bit may have a bit width of 9 bits and may be represented as 9 bits binary number: 9'b ($A_8A_7A_6A_5A_4A_3A_2A_1A_0$). In direct mode, each read result may be packed into the aggregated read result individually, with each read result taking one bit position. The first read result (e.g., $A_0$) may be hard data, while the remaining read results (e.g., $A_1$ through $A_8$) may be either hard data or soft data. Therefore, in direct mode, there may be up to 9 reads for a 9-bit wide index. That is, the maximal total number of reads for direct mode may be 9 for an LLR LUT with 9-bit indices. In indirect mode, the first read result at the first bit position (e.g., $A_0$) may be hard data, while the remaining read results may be accumulated (e.g., added together). In one embodiment, the indirect mode may support up to 32 reads with the read results of the second through $32^{nd}$ accumulated and placed in bit positions 2 through 6 (e.g., $A_1$ through $A_5$). That is, the maximal total number of reads for indirect mode may be 32 for an LLR LUT with 9-bit indices.

In some embodiments, weights for the bits may be assigned based on total number of reads and whether the read results include soft data for subsequent read(s) after the first read. In one embodiment, if the read results include soft data for subsequent read(s) after the first read, the first hard decision read result may be used as a sign bit for the LLR value obtained, weight for the first bit may be assigned to zero (0), each weight for other bits that contain read results may be assigned to one (1) and each weight for remaining bits may be assigned to zero (0). If the read results do not include soft data for subsequent read(s) after the first read, that is, all read results are hard data, each weight for all bits that contain read results may be assigned to one (1) and each weight for remaining bits may be assigned to zero (0) and the sign of the LLR value obtained may be determined based on the weighted index value.

In the examples, a positive LLR value may indicate that the user data bit is more likely to be a "0," while a negative LLR value may indicate it is more likely to be a "1." The absolute value of the LLR value may give the relative confidence in the bit being a "1" or a "0". The higher the magnitude of the LLR value, the more likely the user data bit may be a "1" (if the LLR is negative) or a "0" (if the LLR value is positive).

In one example, referred to as Example One, the set of decoding factors for one multi-read operation may be selected by the non-volatile storage controller 102 as follows: the total number of reads is 5, the aggregation mode is direct mode, the read results are hard data for the first read and soft data for other reads, soft data uses "1" to indicate reliable. The weights $\alpha_i$ with the subscript "i" from zero to eight may be as follows: $\alpha_0$ is zero (0), $\alpha_1 \sim \alpha_4$ are one (1), and $\alpha_5 \sim \alpha_8$ are zero (0). For any LLR_LUT index A, with a 9 bits representation of 9'b ($A_8A_7A_6A_5A_4A_3A_2A_1A_0$), the weighted index value may be obtained by calculation according to the equation of:

$$V = f(A) = \sum_{i=0}^{i=8} \alpha_i \times A_i.$$

Based on the value of V, one LLR value from the pre-selected set of LLR value magnitudes may be mapped to the particular LLR_LUT index. For example, for LLR_LUT index with decimal number 158 (e.g., 'd158), the 9 bits binary number may be 9'b010011110, and the weighted index value may be obtained as $$V = f(A) = \sum_{i=0}^{i=8} \alpha_i \times A_i = 4.$$

The LLR value may be obtained by looking up a mapping table such as Mapping Table One below. For example, the LLR value for LLR_LUT index 'd158 may be "+15" ($A_0$ being 0), and a binary output "5'b01111" from the mapping engine 400.

| V | LLR Value Magnitude | Sign Bit of LLR Value |
|---|---|---|
| 0 | 1 | $A_0$ |
| 1 | 2 | $A_0$ |
| 2 | 3 | $A_0$ |
| 3 | 4 | $A_0$ |
| 4 | 15 | $A_0$ |

MAPPING TABLE ONE

In another example, referred to as Example Two, the set of decoding factors for one multi-read operation may be selected by the non-volatile storage controller 102 as follows: the total number of reads is 6, the aggregation mode is direct mode, and the read results are all hard data. The weights $\alpha_i$ with the subscript "i" from zero to eight may be as follows: $\alpha_0 \sim \alpha_5$ are one (1), and $\alpha_6 \sim \alpha_8$ are zero (0). For the example LLR_LUT index decimal number 158 (e.g., 'd158), the 9 bits binary number may be 9'b010011110, and the weighted index value may be obtained as $$V = f(A) = \sum_{i=0}^{i=8} \alpha_i \times A_i = 4.$$

The LLR value may be obtained by looking up a mapping table such as Mapping Table Two below. For example, the LLR value for LLR_LUT index 'd158 may be "−3" (V being 4 and sign bit being 1) and a binary output "5'b10011" from the mapping engine 400.

| V | LLR Value Magnitude | Sign Bit of LLR Value |
|---|---|---|
| 0 | 15 | 0 |
| 1 | 12 | 0 |
| 2 | 7 | 0 |
| 3 | 3 | 0 |
| 4 | 3 | 1 |
| 5 | 7 | 1 |
| 6 | 15 | 1 |

MAPPING TABLE TWO

In some embodiments, the LLR mapping engine 400 may be a circuit block generated from a hardware description language (e.g., VHDL or VERILOG). That is, the logic for calculation of weighed index values from LLR indices and mapping from weighted index values to LLR value magnitudes may be implemented in the hardware description language, and gate cells implementing the logic may be generated from the hardware description language. In some embodiments, weights for calculation of weighted index values from LLR LUT indices may be determined based on the decoding factors (e.g., total number of reads, aggregation mode, whether the read results contain soft data, etc.). The mapping relationship may be generated by characterizing the non-volatile storage devices (e.g., non-volatile storage device 104) and then translating that characterization data into error models that are then used to generate application-specific LLR LUTs.

Generating an LLR LUT dynamically and adaptively using a hardware LLR engine 112, such as the LLR mapping engine 400, may be better than storing many sets of LLR LUTs and switching between them when conditions change. For example, in a traditional design, firmware needs to manage all the possible sets of LLR LUTs and select the corresponding one based on different configurations. Therefore, the traditional design requires lots of storage space (e.g., in memory 108) to store LUT sets for every possible combination. Meanwhile, the LUT needs to re-programmed or re-configured when a new setting is applied. In a real application, it is not practical for firmware or user to find the best time slot to refresh the LUT contents without impacting the overall system performance.

In contrast to the traditional design, embodiments of the non-volatile storage controller 102 may generate a full LLR_LUT (with N entries) for a decoding operation by adaptively fitting the possible decoding factors combinations, without any firmware intervention. In the embodiment where M being 4, only 16 LLR value magnitudes need to be stored and firmware may update the LLR value magnitudes over the lifetime of a non-volatile storage device. The LLR engine 112 itself (e.g., gate cells) may take up some space in a silicon chip of the non-volatile storage controller 102 but the sacrifice in the slight increase of the silicon area for LLR LUT management is worthwhile. In embodiments of the non-volatile storage system 100, the firmware (e.g., the processor 106 executing instructions in the memory 108) may be configured to selects sets of decoding factors for a plurality of multi-read operations and send commands for the multi-read operations to hardware (e.g., non-volatile storage device 104, ECC engine 110 and LLR engine 112). In one embodiment, for example, 32 commands for 32 multi-read operations may be sent to hardware before decoding for data from any one of 32 commands has been finished.

For the outstanding commands, the hardware of the embodiments may perform the multi-read operations in a pipelined manner. The non-volatile storage device 104 may read data according to the multi-read operations and the data may be received at the non-volatile storage controller 102 in the order or out of order of the commands. As soon as one command has finished reading data from the non-volatile storage device (e.g., 104), in one stage of the pipeline, the LLR engine 112 may generate the LLR LUT for the multi-operation according to the set of decoding factors for the finished command. In another stage of the pipeline, the ECC engine 110 may decode the data for the finished command using the LLR value obtained from the adaptively generated LLR LUT with an aggregated read result as an index.

Figure 5:
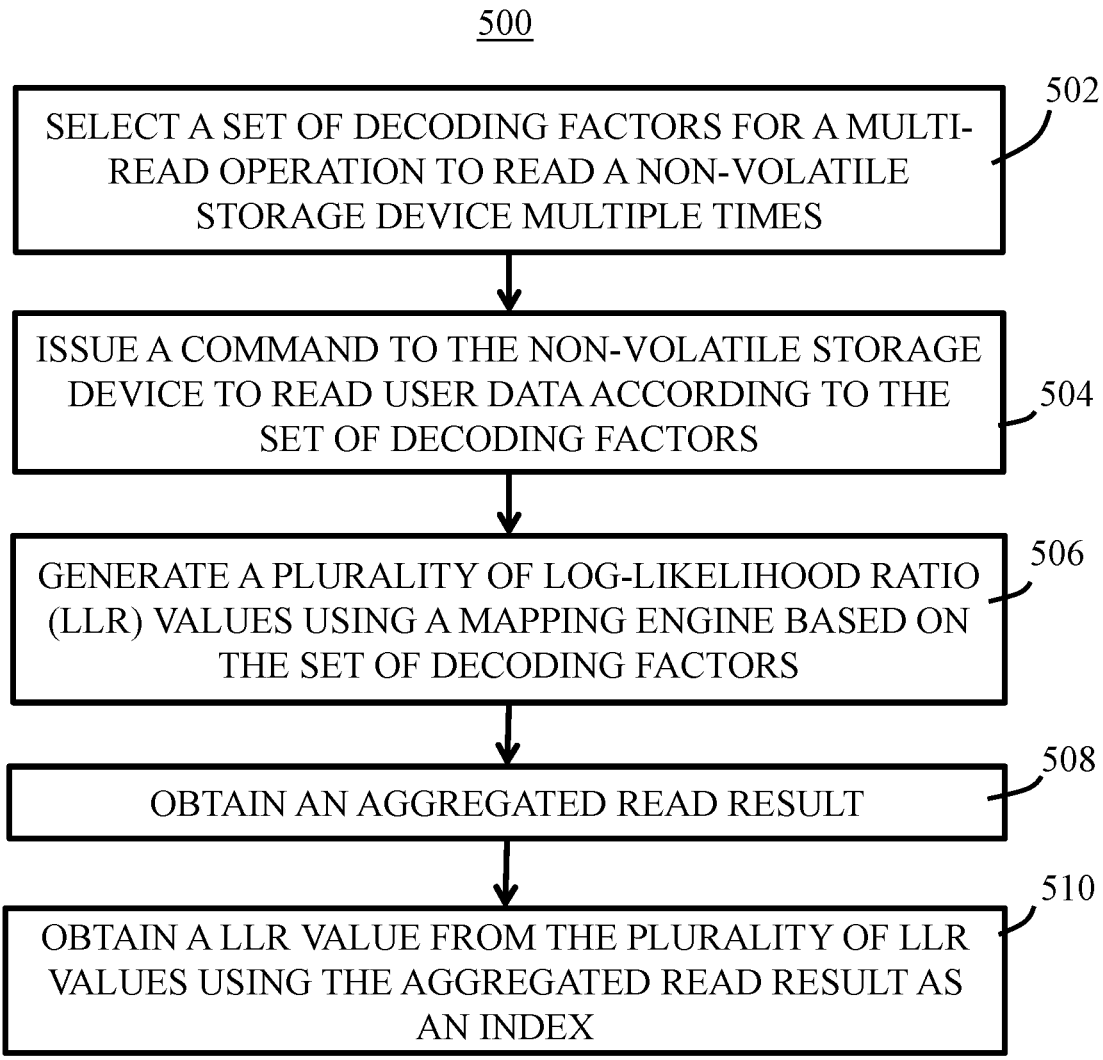
FIG. 5 is a flow diagram of a process for performing a multi-read operation in accordance with an embodiment of the present disclosure.

FIG. 5 is a flow diagram of a process 500 for performing a multi-read operation in accordance with an embodiment of the present disclosure. At block 502, a set of decoding factors may be selected for a multi-read operation to read a non-volatile storage device multiple times. The set of decoding factors may include a total number of reads, an aggregation mode for aggregating read results of multiple reads, and whether the read results include soft data. In one embodiment, the non-volatile storage controller 102 may be configured to select the plurality of decoding factors for a multi-read operation. The total number of reads may specify how many times one user data bit may be read. The aggregation mode may specify whether multiple read results may be aggregated in the direct mode or the indirect mode.

At block 504, a command may be issued to the non-volatile storage device to read user data according to the set of decoding factors. For example, the non-volatile storage controller 102 may issue a read command to the non-volatile storage device 104 to read user data. The read command may specify how many times the user data should be read, whether soft data should be used according to the set of decoding factors. At block 506, a plurality of Log-Likelihood Ratio (LLR) values may be generated using a mapping engine. The mapping engine may output the plurality of LLR values from a pre-selected set of LLR value magnitudes based on the set of decoding factors. Example One and Example Two show two examples that a respective LLR LUT may be generated by the LLR mapping engine 400.

At block 508, an aggregated read result may be obtained in accordance with the aggregation mode. For example, multiple read results for the multi-read operation may be received from the non-volatile storage device 104 and these read results may be aggregated according to the aggregation mode (e.g., direct mode or indirect mode). If, for example, the total number of reads is 5 and 5 read results are 0, 1, 1, 1, 1 from the first read to the fifth read, and the aggregation mode is direct mode, the aggregated read result 9'b000011110 may be obtained. If the total number of reads is 6 and six read results are 0, 1, 1, 1, 1, 0 from the first read to the sixth read, and the aggregation mode is direct mode, the aggregated read result 9'b000011110 may be obtained.

At block 510, an LLR value may be obtained from the plurality of LLR values using the aggregated read result as an index. In one example, if an aggregated read result is the binary number 9'b000011110 for a read command with decoding factors of Example One, the binary number 9'b000011110 may be a decimal number 'd30 and the LLR value for LLR_LUT index 'd30 may be "+15" ($A_0$ being 0), and a binary output "5'b01111" may be obtained as the LLR value from the mapping engine 400. In another example, if an aggregated read result is the binary number 9'b000011110 for a read command with decoding factors of Example Two, the binary number 9'b000011110 may be a decimal number 'd30 and the LLR value for LLR_LUT index 'd30 may be "−3" and a binary output "5'b10011" may be obtained as the LLR value from the mapping engine 400.

Figure 6:
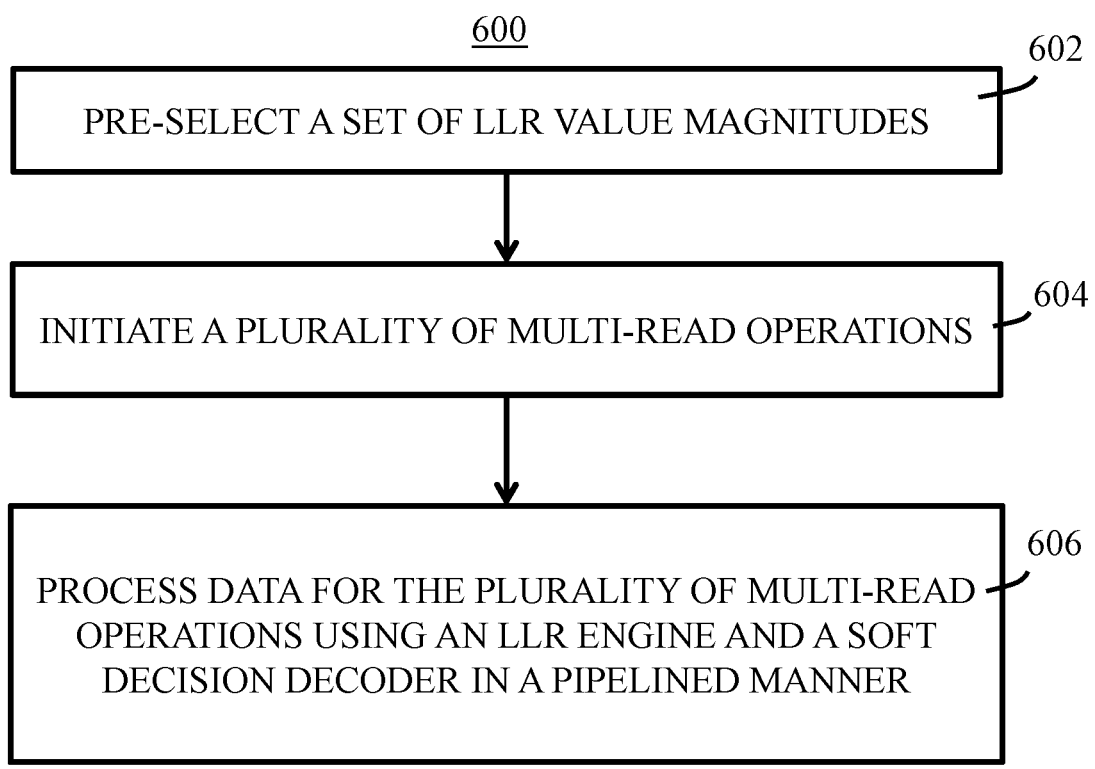
FIG. 6 is a flow diagram of a process for performing a plurality of multi-read operations in accordance with an embodiment of the present disclosure.

FIG. 6 is a flow diagram of a process 600 for performing a plurality of multi-read operations in accordance with an embodiment of the present disclosure. At block 602, a set of Log-Likelihood Ratio (LLR) value magnitudes may be pre-selected. For example, the LLR mapping engine 400 may take a pre-selected set of LLR value magnitudes as inputs. In one embodiment, firmware of the non-volatile storage controller 102 (e.g., software instructions in memory 108 executed by the processor 106) may pre-select the set of LLR value magnitudes to be put into the register bank of the plurality of registers of LLR Value Magnitude 0 through LLR Value Magnitude M−1 based on characterization of the non-volatile storage devices and/or LLR value magnitudes provided by storage device vendors.

At block 604, a plurality of multi-read operations may be initiated. For example, firmware of the non-volatile storage controller 102 (e.g., software instructions in memory 108 executed by the processor 106) may select a respective set of decoding factors for each of the plurality of multi-read operations and send read commands corresponding to the plurality of multi-read operations. In at least one embodiment, each respective set of decoding factors may include a total number of reads, an aggregation mode for aggregating read results of multiple reads, and whether the read results include soft data.

At block 606, data of the plurality of multi-read operations may be processed using a mapping engine and a soft decision decoder in a pipelined manner. For example, when the plurality of multi-read operations are carried out, the non-volatile storage device (e.g., NVM 104) may return data for the multi-read operations respectively, which may occur the order or out of order of the read commands. When one of the plurality of multi-read operations that has finished reading data (e.g., all data for this multi-read operation has been received), in a first pipeline stage, the LLR engine 112 may generate an LLR lookup table (LUT) from the set of LLR value magnitudes based on a set of decoding factors corresponding to the finished multi-read operation. Then, in a second pipeline stage, the soft decision decoder may perform a soft decision decoding using an LLR value obtained from the LLR LUT with an aggregated read result as an index.

The processes 500 and 600 and features of the non-volatile storage system 100 related to multi-read operations may be implemented using software (e.g., executable by a computer processor (CPU, GPU, or both)), hardware (e.g., a field-programmable gate array (FPGA) or an application-specific IC (ASIC), firmware, or any suitable combination of the three. In one embodiment, for example, certain steps of the processes 500 and 600 and features of the non-volatile storage system 100 related to selection of LLR value magnitudes to be fed into the LLR engine and selection of decoding factors may be programmed in computer processor executable instructions, stored in a non-transitory machine-readable medium (e.g., the memory 108, the non-volatile storage device 104, hard drive, CD, DVD, etc.) and performed by the processor 106 (e.g., a microprocessor or a microcontroller) executing the executable instructions. And certain steps of the processes 500 and 600 and features of the non-volatile storage system 100, for example, the generation of LLR LUTs and decoding using LLR values from the LLR LUTs may be performed by hard circuit blocks, such as the LLR engine 112 and ECC engine 110.

In an exemplary embodiment, there is provided a method that may comprise selecting a set of decoding factors for a multi-read operation to read a non-volatile storage device multiple times. The set of decoding factors may include a total number of reads, an aggregation mode for aggregating read results of multiple reads, and whether the read results include soft data. The method may further comprise issuing a command to the non-volatile storage device to read user data according to the set of decoding factors, generating a plurality of Log-Likelihood Ratio (LLR) values using a mapping engine that outputs the plurality of LLR values from a pre-selected set of LLR value magnitudes based on the set of decoding factors, obtaining an aggregated read result in accordance with the aggregation mode, and obtaining an LLR value from the plurality of LLR values using the aggregated read result as an index.

In one embodiment, the read results may include soft data and the set of decoding factors may further include whether the soft data uses either one (1) or zero (0) to indicate reliable.

In one embodiment, the aggregation mode may be either a direct mode, in which the multiple results are individually placed in the aggregated read result with each read result taking one bit position, or an indirect mode, in which a first read result is placed in a first bit position and remaining read results are accumulated into a sum to be placed in the aggregated read result.

In one embodiment, the pre-selected set of LLR value magnitudes may be put into a plurality of registers of a register bank and the register bank may be coupled to the mapping engine as input to the mapping engine.

In one embodiment, the plurality of LLR values generated by the mapping engine may be entries of an LLR lookup table, each entry of the LLR lookup table may be mapped to one of the pre-selected set of LLR value magnitudes by a weighted index value calculated from an index of the entry with weights for calculating the weighted index value determined based on the set of decoding factors and mapping determined based on a mapping table.

In one embodiment, the mapping table may define a sign bit to be added in each entry of the LLR lookup table.

In one embodiment, the method may further comprise performing a soft decision decoding using a soft decision decoder with LLR value obtained from the plurality of LLR values.

In one embodiment, the mapping engine and the soft decision decoder may be two pipeline stages of a hardware pipeline for processing data for a plurality of multi-read operations.

In another exemplary embodiment, there is provided a storage system controller. The storage system controller may comprise a processor configured to: select a set of decoding factors for a multi-read operation to read a non-volatile storage device multiple times, and issue a command to the non-volatile storage device to read user data according to the set of decoding factors. The set of decoding factors may include a total number of reads, an aggregation mode for aggregating read results of multiple reads, and whether the read results include soft data. The storage system controller may further comprise a mapping engine configured to generate a plurality of Log-Likelihood Ratio (LLR) values from a pre-selected set of LLR value magnitudes based on the set of decoding factors and a soft decision decoder. The soft decision decoder may be configured to obtain an LLR value from the plurality of LLR values using an aggregated read result as an index and perform a soft decision decoding using the LLR value. The aggregated read result may be obtained in accordance with the aggregation mode.

In one embodiment, the read results may include soft data and the set of decoding factors may further include whether the soft data uses either one (1) or zero (0) to indicate reliable.

In one embodiment, the aggregation mode may be either a direct mode, in which the multiple results are individually placed in the aggregated read result with each read result taking one bit position, or an indirect mode, in which a first read result is placed in a first bit position and remaining read results are accumulated into a sum to be placed in the aggregated read result.

In one embodiment, the pre-selected set of LLR value magnitudes may be put into a plurality of registers of a register bank and the register bank may be coupled to the mapping engine to as input to the mapping engine.

In one embodiment, the plurality of LLR values generated by the mapping engine may be entries of an LLR lookup table, each entry of the LLR lookup table may be mapped to one of the pre-selected set of LLR value magnitudes by a weighted index value calculated from an index of the entry with weights for calculating the weighted index value determined based on the set of decoding factors and mapping determined based on a mapping table.

In one embodiment, the mapping table may define a sign bit to be added in each entry of the LLR lookup table.

In one embodiment, the mapping engine and the soft decision decoder may be two pipeline stages of a hardware pipeline for processing data for a plurality of multi-read operations.

In yet another exemplary embodiment, there is provided a method comprising pre-selecting a set of Log-Likelihood Ratio (LLR) value magnitudes, initiating a plurality of multi-read operations by selecting a respective set of decoding factors for each of the plurality of multi-read operations and issuing read commands corresponding to the plurality of multi-read operations. Each respective set of decoding factors may include a total number of reads, an aggregation mode for aggregating read results of multiple reads, and whether the read results include soft data. The method may further comprise processing the plurality of multi-read operations using a mapping engine and a soft decision decoder in a pipelined manner. In a first pipeline stage, the mapping engine may generate an LLR lookup table (LUT) from the set of LLR value magnitudes based on a set of decoding factors corresponding to one of the plurality of multi-read operations that has finished reading data. And in a second pipeline stage, the soft decision decoder may perform soft decision decoding using an LLR value obtained from the LLR LUT with an aggregated read result as an index. The aggregated read result may be obtained in accordance with the aggregation mode in the set of decoding factors corresponding to the one of the plurality of multi-read operations that has finished reading data.

In one embodiment, the read results for at least one of the plurality of multi-read operations may include soft data and the set of decoding factors corresponding to the at least one of the plurality of multi-read operations may further include whether the soft data uses either one (1) or zero (0) to indicate reliable.

In one embodiment, the aggregation mode in each respective set of decoding factors may be either a direct mode, in which the multiple results are individually placed in the aggregated read result with each read result taking one bit position, or an indirect mode, in which a first read result is placed in a first bit position and remaining read results are accumulated into a sum to be placed in the aggregated read result.

In one embodiment, the set of LLR value magnitudes may be put into a plurality of registers of a register bank and the register bank may be coupled to the mapping engine as input to the mapping engine.

In one embodiment, each entry of the LLR LUT may be mapped to one of the pre-selected set of LLR value magnitudes by a weighted index value calculated from an index of the entry, weights for calculating the weighted index value may be determined based on the set of decoding factors and mapping may be determined based on a mapping table, and the mapping table may define a sign bit to be added in each entry of the LLR LUT.

Any of the disclosed methods (e.g., the process 600) and operations may be implemented in software comprising computer-executable instructions stored on one or more computer-readable storage media. The one or more computer-readable storage media may include non-transitory computer-readable media (such as removable or non-removable magnetic disks, magnetic tapes or cassettes, solid state drives (SSDs), hybrid hard drives, CD-ROMs, CD-RWs, DVDs, or any other tangible storage medium), volatile memory components (such as DRAM or SRAM), or non-volatile memory components (such as hard drives)). The computer-executable instructions may be executed on a computer (e.g., any commercially available computer, including smart phones or other mobile devices that include computing hardware) by a computer processor (e.g., a CPU, a GPU, or both).

Embodiments according to the present disclosure, may be implemented for any types of ECC codes, such as, but not limited to, rectangular parity, Turbo, Low-Density Parity-Check (LDPC), Polar, and Hamming code.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
   selecting a set of decoding factors for a multi-read operation to read a non-volatile storage device multiple times, the set of decoding factors including an aggregation mode for aggregating read results of multiple reads;
   issuing a command to the non-volatile storage device to read user data according to the set of decoding factors;
   generating a plurality of Log-Likelihood Ratio (LLR) values using a mapping engine that outputs the plurality of LLR values from a pre-selected set of LLR value magnitudes based on the set of decoding factors, wherein the pre-selected set of LLR value magnitudes are put into a plurality of registers of a register bank and the register bank is coupled to the mapping engine as input to the mapping engine;

obtaining an aggregated read result in accordance with the aggregation mode; and obtaining an LLR value from the plurality of LLR values using the aggregated read result as an index.

2. The method of claim 1, wherein the read results include soft data and the set of decoding factors further include whether the soft data uses either one (1) or zero (0) to indicate reliable.

3. The method of claim 1, wherein the aggregation mode is either a direct mode, in which the multiple results are individually placed in the aggregated read result with each read result taking one bit position, or an indirect mode, in which a first read result is placed in a first bit position and remaining read results are accumulated into a sum to be placed in the aggregated read result.

4. The method of claim 1, wherein the plurality of LLR values generated by the mapping engine are entries of an LLR lookup table, each entry of the LLR lookup table is mapped to one of the pre-selected set of LLR value magnitudes by a weighted index value calculated from an index of the entry with weights for calculating the weighted index value determined based on the set of decoding factors and mapping determined based on a mapping table.

5. The method of claim 4, wherein the mapping table defines a sign bit to be added in each entry of the LLR lookup table.

6. The method of claim 1, further comprising performing a soft decision decoding using a soft decision decoder with LLR value obtained from the plurality of LLR values.

7. The method of claim 6, wherein the mapping engine and the soft decision decoder are two pipeline stages of a hardware pipeline for processing data for a plurality of multi-read operations.

8. A storage system controller, comprising:

a processor configured to:
   select a set of decoding factors for a multi-read operation to read a non-volatile storage device multiple times, the set of decoding factors including an aggregation mode for aggregating read results of multiple reads;
   issue a command to the non-volatile storage device to read user data according to the set of decoding factors;

a mapping engine configured to generate a plurality of Log-Likelihood Ratio (LLR) values from a pre-selected set of LLR value magnitudes based on the set of decoding factors; and a soft decision decoder configured to:
   obtain an LLR value from the plurality of LLR values using an aggregated read result as an index, the aggregated read result being obtained in accordance with the aggregation mode; and
   perform a soft decision decoding using the LLR value.

9. The storage system controller of claim 8, wherein the read results include soft data and the set of decoding factors further include whether the soft data uses either one (1) or zero (0) to indicate reliable.

10. The storage system controller of claim 8, wherein the aggregation mode is either a direct mode, in which the multiple results are individually placed in the aggregated read result with each read result taking one bit position, or an indirect mode, in which a first read result is placed in a first bit position and remaining read results are accumulated into a sum to be placed in the aggregated read result.

11. The storage system controller of claim 8, wherein the pre-selected set of LLR value magnitudes are put into a plurality of registers of a register bank and the register bank is coupled to the mapping engine to as input to the mapping engine.

12. The storage system controller of claim 8, wherein the plurality of LLR values generated by the mapping engine are entries of an LLR lookup table, each entry of the LLR lookup table is mapped to one of the pre-selected set of LLR value magnitudes by a weighted index value calculated from an index of the entry with weights for calculating the weighted index value determined based on the set of decoding factors and mapping determined based on a mapping table.

13. The storage system controller of claim 8, wherein the mapping table defines a sign bit to be added in each entry of the LLR lookup table.

14. The storage system controller of claim 8, wherein the mapping engine and the soft decision decoder are two pipeline stages of a hardware pipeline for processing data for a plurality of multi-read operations.

15. A method, comprising:

pre-selecting a set of Log-Likelihood Ratio (LLR) values;

initiating a plurality of multi-read operations by selecting a respective set of decoding factors for each of the plurality of multi-read operations and issuing read commands corresponding to the plurality of multi-read operations, each respective set of decoding factors including an aggregation mode for aggregating read results of multiple reads; and processing the plurality of multi-read operations using a mapping engine and a soft decision decoder in a hardware pipeline, wherein, in a first pipeline stage of the hardware pipeline, the mapping engine generates an LLR lookup table (LUT) from the set of LLR value magnitudes based on a set of decoding factors corresponding to one of the plurality of multi-read operations that has finished reading data, and in a second pipeline stage of the hardware pipeline, the soft decision decoder performs soft decision decoding using an LLR value obtained from the LLR LUT with an aggregated read result as an index, the aggregated read result being obtained in accordance with the aggregation mode in the set of decoding factors corresponding to the one of the plurality of multi-read operations that has finished reading data.

16. The method of claim 15, wherein the read results for at least one of the plurality of multi-read operations include soft data and the set of decoding factors corresponding to the at least one of the plurality of multi-read operations further include whether the soft data uses either one (1) or zero (0) to indicate reliable.

17. The method of claim 15, wherein the aggregation mode in each respective set of decoding factors is either a direct mode, in which the multiple results are individually placed in the aggregated read result with each read result taking one bit position, or an indirect mode, in which a first read result is placed in a first bit position and remaining read results are accumulated into a sum to be placed in the aggregated read result.

18. The method of claim 15, wherein the set of LLR value magnitudes are put into a plurality of registers of a register bank and the register bank is coupled to the mapping engine as input to the mapping engine.

19. The method of claim 15, wherein each entry of the LLR LUT is mapped to one of the pre-selected set of LLR value magnitudes by a weighted index value calculated from an index of the entry, weights for calculating the weighted index value are determined based on the set of decoding factors and mapping is determined based on a mapping table, and the mapping table defines a sign bit to be added in each entry of the LLR LUT.

20. A method, comprising:
  selecting a set of decoding factors for a multi-read operation to read a non-volatile storage device multiple times, the set of decoding factors including an aggregation mode for aggregating read results of multiple reads;
  issuing a command to the non-volatile storage device to read user data according to the set of decoding factors;
  generating a plurality of Log-Likelihood Ratio (LLR) values using a mapping engine that outputs the plurality of LLR values from a pre-selected set of LLR value magnitudes based on the set of decoding factors;
  obtaining an aggregated read result in accordance with the aggregation mode;
  obtaining an LLR value from the plurality of LLR values using the aggregated read result as an index; and
  performing a soft decision decoding using a soft decision decoder with LLR value obtained from the plurality of LLR values, wherein the mapping engine and the soft decision decoder are two pipeline stages of a hardware pipeline for processing data for a plurality of multi-read operations.

* * * * *